(12) United States Patent
Lastrucci

(10) Patent No.: US 12,058,500 B2
(45) Date of Patent: Aug. 6, 2024

(54) ACOUSTIC AMPLIFICATION APPARATUS

(71) Applicant: POWERSOFT S.P.A., Scandicci (IT)

(72) Inventor: Claudio Lastrucci, Lastra a Signa (IT)

(73) Assignee: POWERSOFT S.P.A., Scandicci (IT)

( * ) Notice: Subject to any disclaimer, the term of this patent is extended or adjusted under 35 U.S.C. 154(b) by 582 days.

(21) Appl. No.: 17/307,189

(22) Filed: May 4, 2021

(65) Prior Publication Data

US 2021/0352409 A1   Nov. 11, 2021

(30) Foreign Application Priority Data

May 5, 2020  (IT) .................. 102020000009928

(51) Int. Cl.
*H04R 5/00* (2006.01)
*H04R 5/02* (2006.01)
*H05K 7/14* (2006.01)

(52) U.S. Cl.
CPC ............. *H04R 5/02* (2013.01); *H05K 7/1425* (2013.01); *H04R 2201/401* (2013.01)

(58) Field of Classification Search
CPC ... H04R 5/02; H04R 2201/401; H05K 7/1425
See application file for complete search history.

(56) References Cited

U.S. PATENT DOCUMENTS

| | | |
|---|---|---|
| 5,209,356 A | 5/1993 | Chaffee |
| 7,100,999 B2 * | 9/2006 | Stravitz ................ A47F 3/004 |
| | | 312/351 |
| 9,716,961 B2 | 7/2017 | Oellers et al. |
| 10,219,400 B2 * | 2/2019 | Klaba .................. H05K 5/0021 |
| 2016/0029506 A1 * | 1/2016 | Franklin ............. H05K 5/0247 |
| | | 211/26 |

FOREIGN PATENT DOCUMENTS

| | | | |
|---|---|---|---|
| GB | 2229876 A | * 10/1990 | ............. H04B 1/202 |
| GB | 2229876 A | 10/1990 | |

OTHER PUBLICATIONS

Berkhout, A. J., "A Holographic Approach to Acoustic Control", Journal of the Audio Engineering Society, vol. 36, No. 12, Dec. 1988, pp. 977-995.

* cited by examiner

*Primary Examiner* — Pete T Lee
(74) *Attorney, Agent, or Firm* — PEARNE & GORDON LLP

(57) ABSTRACT

A modular, acoustic amplification apparatus (100) comprises: a first module (1), including a first casing (11) and an acoustic amplifier (12) positioned inside the first casing (11), wherein the first casing (11) has the shape of a parallelepiped having a first base and a first height (H1), wherein the first base has a first long side (L1) and a first short side (C1); a second module (2) including a second casing (21) and a power supply or an accumulator positioned inside the second casing (21), wherein the second casing (21) has the shape of a parallelepiped having a second base and a second height (H2), wherein the second base has a second long side (L2) and a second short side (C2).

23 Claims, 13 Drawing Sheets

ACOUSTIC AMPLIFICATION APPARATUS

This invention relates to a modular acoustic amplification apparatus.

This invention addresses the field of acoustic amplification; more specifically, the field of this invention is wave field synthesis for reproducing audio signals. Known from patent document U.S. Pat. No. 9,716,961B2 is a wave field synthesis system comprising a plurality of units, each including a plurality of sound transducers.

GB2229876 and U.S. Pat. No. 5,209,356 also disclose a wave field synthesis system. In this field, there is a need for sound amplification apparatuses which can be made quickly and flexibly according to sound reproduction needs such as electrical power requirement and desired frequency channels.

The aim of this invention is to provide an apparatus and a method for making an acoustic amplification apparatus to overcome at least one of the above mentioned disadvantages of the prior art.

This aim is fully achieved by the apparatus and method of this disclosure as characterized in the appended claims.

According to one aspect of it, this disclosure relates to an acoustic amplification apparatus. It should be noted that the apparatus of this invention is modular, that is to say, it comprises a plurality of modules that can be assembled in a plurality of different configurations.

More specifically, the apparatus comprises (at least) a first module and a second module. The first module includes a first casing. The first casing has the shape of a parallelepiped having a first base and a first height. The first base has a first long side and first short side. The first short side is smaller in length than the first long side. Preferably, the first base is rectangular. The first module also includes an acoustic amplifier positioned inside the first casing (that is, in a space within the first casing).

The second module includes a second casing. The second casing has the shape of a parallelepiped having a second base and a second height. The second base has a second long side and second short side. The second short side is smaller in length than the second long side. Preferably, the second base is rectangular. The second module also includes a power supply or an accumulator positioned inside the second casing (that is, in a space within the second casing). More generally speaking, the second module comprises an electric power unit, located in the second casing.

The first casing and the second casing include respective fastening portions which can be placed at a position where they are aligned with each other to allow connecting the first module to the second module. The apparatus also includes fastening elements, associable with the fastening portions of the first and the second module to allow connecting the first module to the second module.

Preferably, the length of the second long side of the second casing is equal to the length of the first short side of the first casing. That way, the modules can be placed with the second long side of the second casing superposed on, or adjacent to, the second long side of the second casing. Preferably, also, the length of the second short side is half the length of the first long side. That way, two second modules can be placed on top of the first module to obtain an apparatus having the shape of a parallelepiped. In another embodiment, the length of the second short side is a third (or a quarter or a fifth) of the length of the first long side; that way, three (or four or five) second modules can be placed on top of the first module. More generally speaking, the length of the second short side is a submultiple of the length of the first long side.

Preferably, the first height is half the second height. This feature facilitates transportation because it means the modules can be transported in packs of standard size.

It should be noted that when the modules are installed in a rack unit, they are provided with a fastening enclosure, in addition to the casing. The fastening enclosure may itself be part of the apparatus according to this description. The fastening enclosure comprises a facia panel (which is applied on a vertical wall of the module, for example, along a long side) and trailing end members (which are applied on a vertical wall opposite to the one the facia panel is applied on).

The dimensions of the modules are selected to allow the modules, in different embodiments, to be installed in standard size racks (for example, 19 inches or 23 inches). More specifically, the dimensions of the first and second modules, when assembled with the fastening enclosure, are directly referable to those of a standard rack (for example, 19 inches or 23 inches).

It is also noted that the first casing includes a first upper base, parallel to the first base (or lower base); preferably, the first upper base defines a plurality of fins. The fins have a heat dissipation function. Still more preferably, the fins of the first upper base are oriented in parallel with the first short side. That way, they define heat circulation grooves oriented in parallel with the first short side; thus, the air circulating between the fins can flow in from a front side and out through a rear side of the apparatus. The first (lower) base can also be provided with fins, preferably oriented in parallel with the first short side.

According to an aspect of this disclosure, the apparatus comprises a third module. The third module includes a third casing. The third casing has the shape of a parallelepiped having a third base and a third height. The third base has a third long side and a third short side. The third short side is smaller in length than the third long side. Preferably, the third base is rectangular. The third module also includes a power supply or an accumulator positioned inside the third casing (that is, in a space within the third casing). The accumulator includes a plurality of capacitors. More generally speaking, the third module comprises an electric power unit, located in the third casing.

It should be noted that in one embodiment, the apparatus includes the second module and the third module but not the first module. In this embodiment, the second module and the third module may be placed beside one another or on top of one another.

The third casing includes respective fastening portions which can be placed at a position where they are aligned with the first module and/or the second module to allow connecting the third module to the first and/or the second module. The apparatus also includes fastening elements, associable with the fastening portions of the third module to allow connecting the third module to the first and/or the second module.

Preferably, the length of the third short side is equal to the length of the second short side and/or the length of the third long side is equal to the length of the second short side. Also, the third height is equal to the second height. Still more preferably, the third casing is the same size as the second casing.

Preferably, the second module includes a power supply, positioned inside the second casing. In this case, the second module includes a connector that is configured to connect the power supply to the external network. The third module also includes an accumulator positioned inside the third casing.

Further, the second casing has a second upper base that is parallel to the second base (or second lower base); the second upper base may define a plurality of fins, oriented in parallel with the second long side. That way, they define air circulation grooves parallel to the second long side; thus, the air circulating between the fins can flow in from a front side and out through a rear side of the apparatus.

Preferably, the fins of the first casing are oriented in parallel with the fins of the second casing.

The second (lower) base can also be provided with fins, preferably oriented in parallel with the first short side.

Generally speaking, the apparatus may comprise a plurality of additional modules, besides the first and the second module; the plurality of additional modules each include a respective casing having the same dimensions as the first casing or the second casing. Further, each additional module, if the respective casing has the same dimensions as the first casing, comprises an additional amplifier; if the respective casing has the same dimensions as the second casing, on the other hand, it comprises an accumulator or a power supply. The apparatus is made up of a plurality of modules, each including an amplifier, a power supply or an accumulator, depending on the required specifications for the apparatus. More specifically, if the apparatus is required to have high power, it will be provided with a plurality of modules having the dimensions of the second casing and including a corresponding plurality of power supplies. If the apparatus is required to have many channels, it will be provided with a plurality of modules having the dimensions of the first casing and including a corresponding plurality of amplifiers. If the apparatus is required to have a very high-energy frequency, with limited absorption from the network, it will be provided with one or more modules having the dimensions of the third casing (or of the second casing) and including one or more accumulators.

In an embodiment, the first upper base of the first casing includes a first plurality of holes. Preferably, the first plurality of holes is located along an outer perimeter of the first upper base. The holes of a first group of the plurality of holes (specifically, four holes) are located at the respective corners of the first upper base. That way, the holes do not occupy space inside the casing.

The second base of the second casing is superposable on the first upper base of the first casing; the second (lower) base includes a second plurality of holes, aligned with the first plurality of holes to allow the connection between the first module and the second module. Preferably, the second plurality of holes is located along an outer perimeter of the second lower base. The holes of a first group of the plurality of holes (specifically, four holes) are located at the respective corners of the second lower base.

The holes of the first upper base and of the second (lower) base form the fastening portions. The apparatus also includes a plurality of screws or pins, each of which is inserted (or insertable) into a hole of the second (lower) base and into a hole of the first upper base to connect the first module to the second module. The pins or screws are an example of the fastening elements.

The holes of the first upper base extend transversely to the first upper base through the first casing as far as the first (lower) base. Thus, the first casing includes a plurality of through holes, extending between the first (lower) base and the first upper base.

Similarly, the holes of the second upper base extend transversely to the second upper base through the second casing as far as the second (lower) base. Thus, the second casing includes a plurality of through holes, extending between the second (lower) base and the second upper base. The holes form the fastening portions.

The first casing includes a first flank, parallel to the first height and to the first short side; the second casing includes a second flank, parallel to the second height and to the second long side. The fastening portions of the first and second casings are configured to allow connecting the first module to the second module in an operating configuration in which the first flank of the first casing is juxtaposed with the second flank of the second casing. Similarly, the third casing includes a third flank, parallel to the third height and to the third long side; the fastening portions of the third casing are configured to allow connecting the third module to the first module and/or to the second module in an operating configuration in which the third flank of the third casing is juxtaposed with the second flank of the second casing (and/or the first flank of the first casing).

The first module and the second module (and the third module) include respective electrical connectors, configured to allow electrically connecting the first module and the second module (and the third module). The electrical connector of the first module is located along the first short side. This is not an essential feature, since, in some embodiments, the electrical connector of the first module may be also located along the first long side. The electrical connector of the second module is located along the second long side. The electrical connector of the third module is located along the third long side.

Also these features are not essential, since the electrical connector of the second module and the electrical connector of the third module may be placed in the second short side and third short side, respectively.

In fact, more in general, the present disclosure provides a solution wherein the electrical connector of the first module is located on a side which is coincident (is aligned with), after the assembly of the apparatus, with a side of the second module and the side of the third module wherein the respective electrical connector is located.

Preferably, the electrical connectors of the first module and of the second module (and of the third module) are palindromic connectors. Palindromic connectors are symmetrical so as to allow connecting each connector to another connector at at least two different relative positions (specifically, at two different positions at 180° from each other) without having to twist the connector (which, in one embodiment, includes a flat rigid cable). This increases the possibilities of interconnecting the modules.

The apparatus of this disclosure is applicable in wave field synthesis.

It is noted that this disclosure also provides a wave field synthesis system comprising a plurality of apparatuses according to one or more aspects of this disclosure. The wave field synthesis system functions according to the approach described in the document Berkhout, A. J., "A holographic approach to acoustic control". Journal of the Audio Engineering Society, Vol. 36, No. 12, December 1988, pp-977-998.

This disclosure also provides a method for making (that is, assembling) an acoustic amplification apparatus. Thus, this disclosure also provides a method for acoustic amplification. The method comprises a step of preparing a first module, the first module being according to one or more of the aspects of this disclosure. The method comprises a step of preparing a second module, the second module being according to one or more of the aspects of this disclosure. The method comprises a step of connecting the first module to the second module by means of respective fastening portions for fastening the first casing and the second casing; more specifically, the fastening portions are located at a position where they are aligned with each other to allow fastening.

The method may also comprise a step of preparing a third module, the third module being according to one or more of the aspects of this disclosure. The method may comprise a step of connecting the third module to the first module and/or to the second module.

More generally speaking, the method may comprise a step of preparing a plurality of modules, where the modules are according to one or more of the aspects of this disclosure, and a step of interconnecting the modules. The method may also comprise a step of assembling a plurality of acoustic amplification apparatuses, where each acoustic amplification apparatus includes a respective first module and a respective second module to form a wave field synthesis system.

These and other features will become more apparent from the following description of a preferred embodiment, illustrated by way of non-limiting example in the accompanying drawings, in which.

Figure 1:
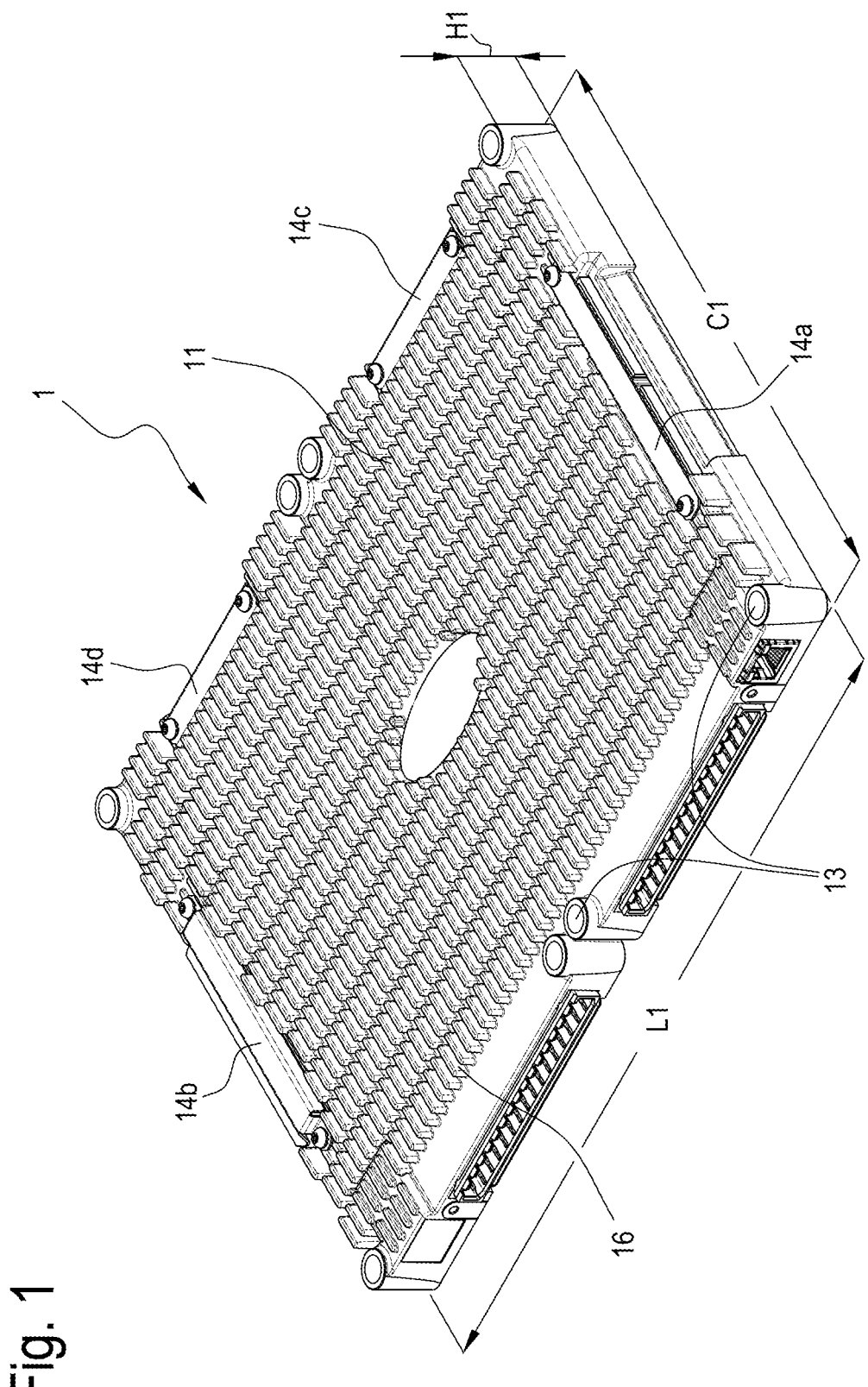
FIG. 1 shows a perspective view of a first module of an acoustic amplification apparatus according to this disclosure.
Figure 2:
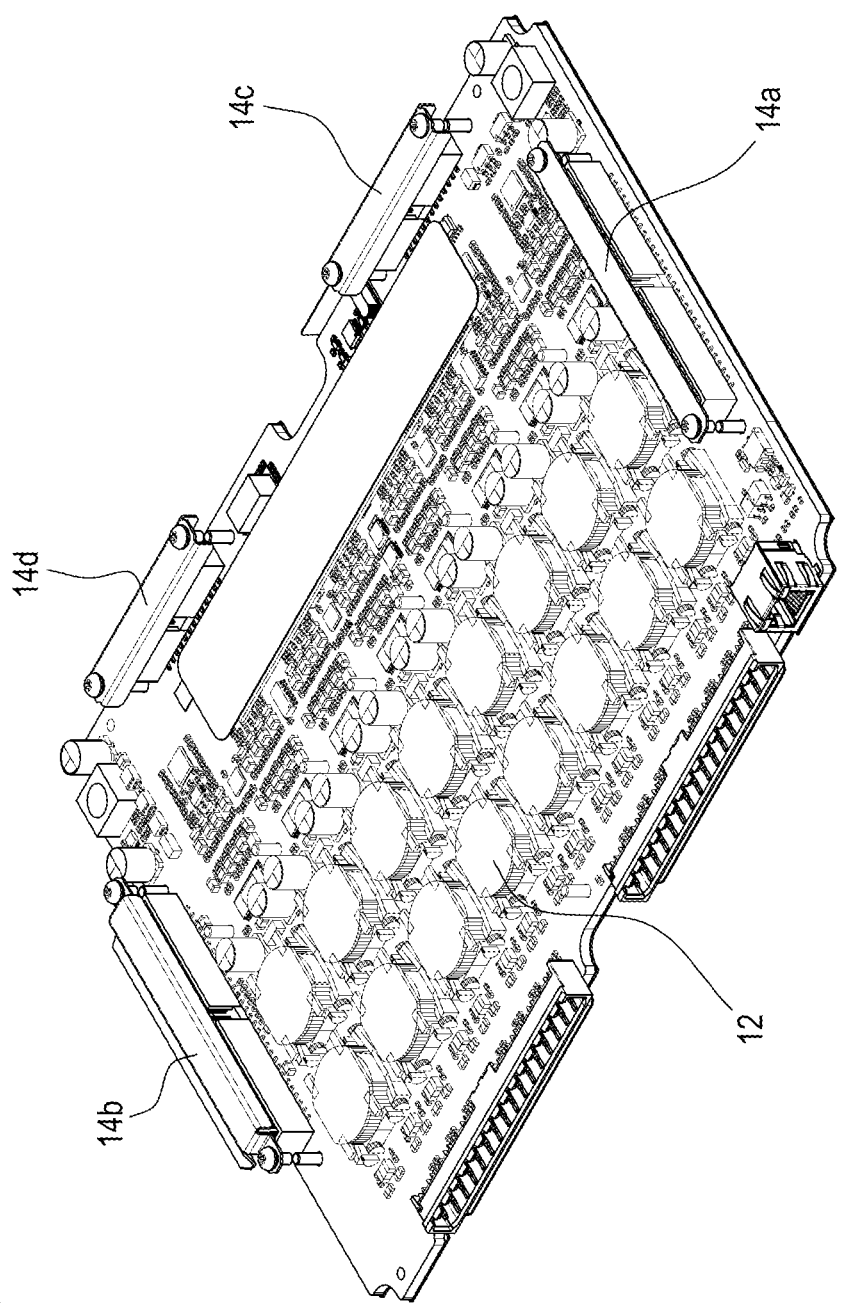
FIG. 2 illustrates the interior of the first module of FIG. 1.
Figure 3:
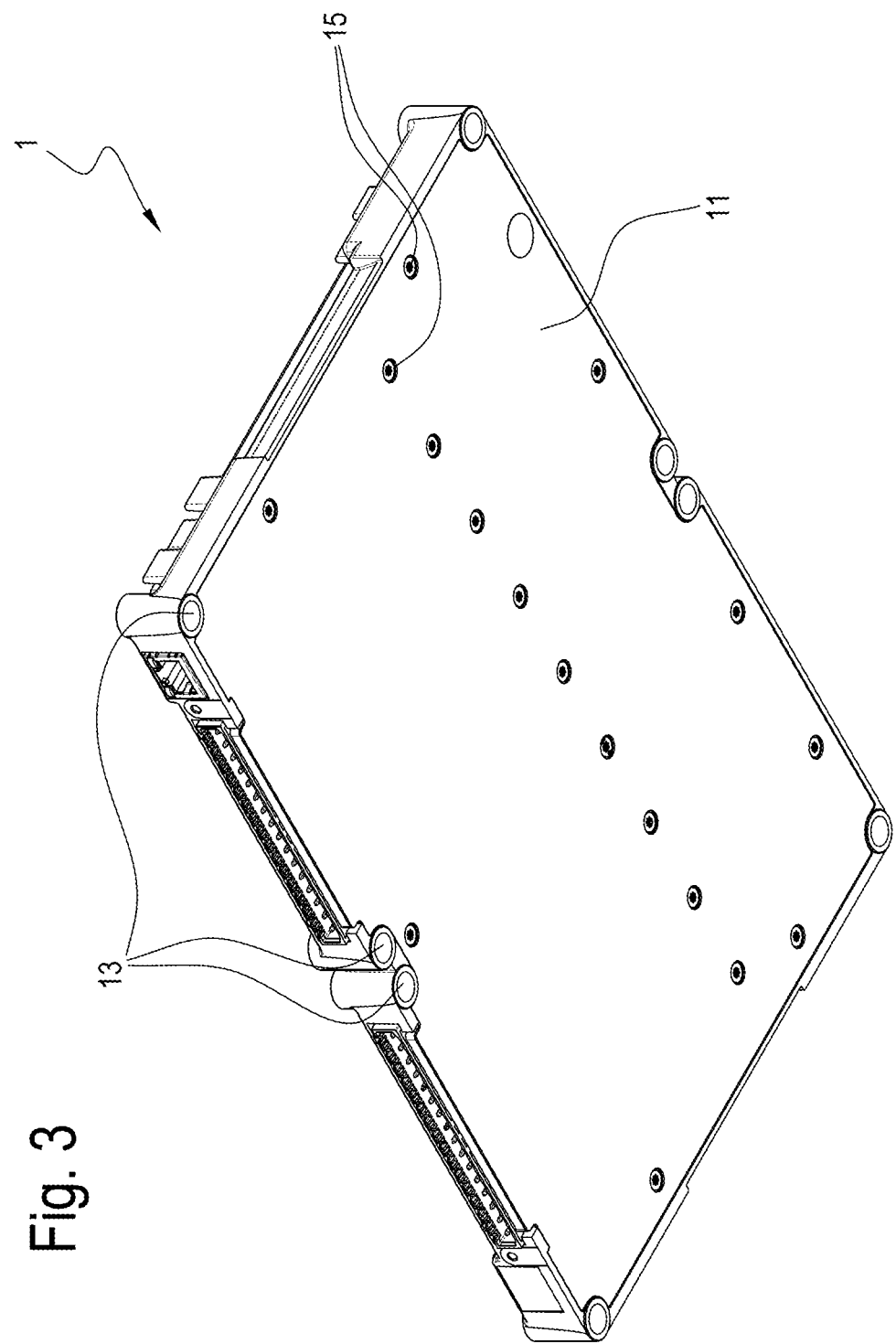
FIG. 3 shows the first module of FIG. 1 in a further perspective view.
Figure 4:
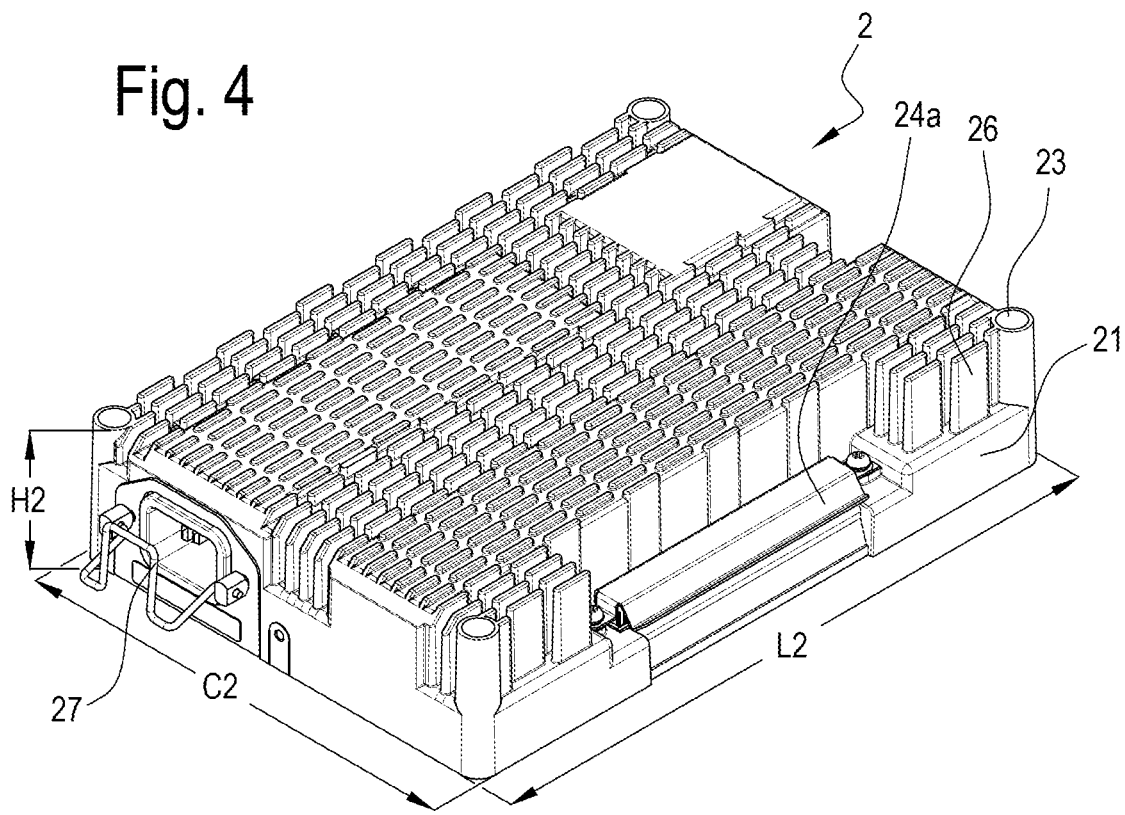
FIGS. 4 and 5 show respective perspective views of a second module of the acoustic amplification apparatus.
Figure 5:
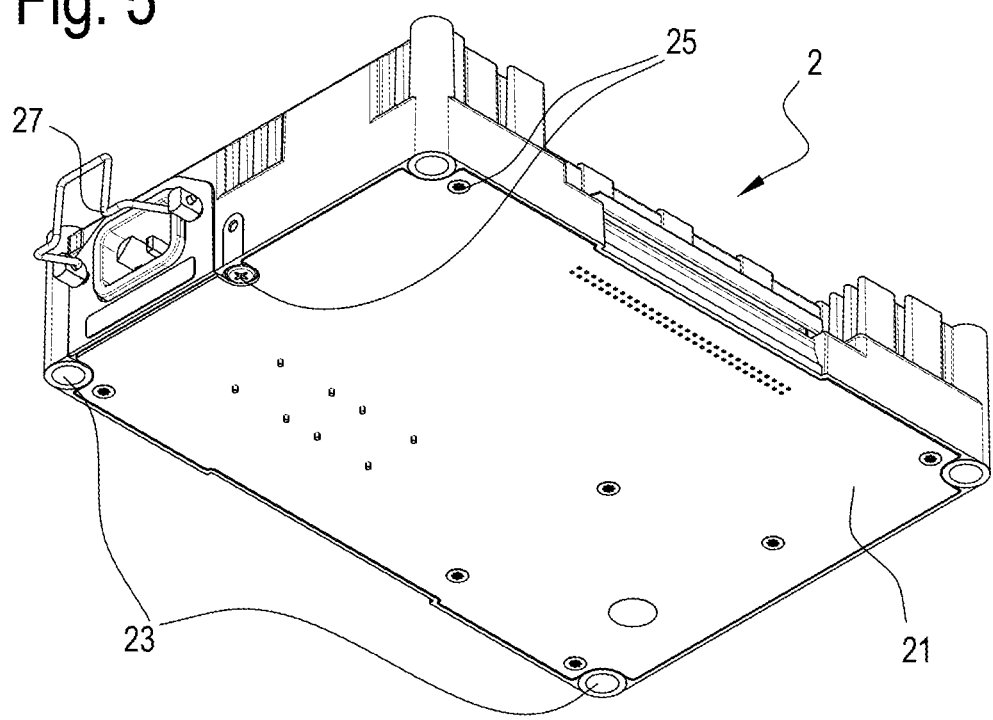
Figure 6:
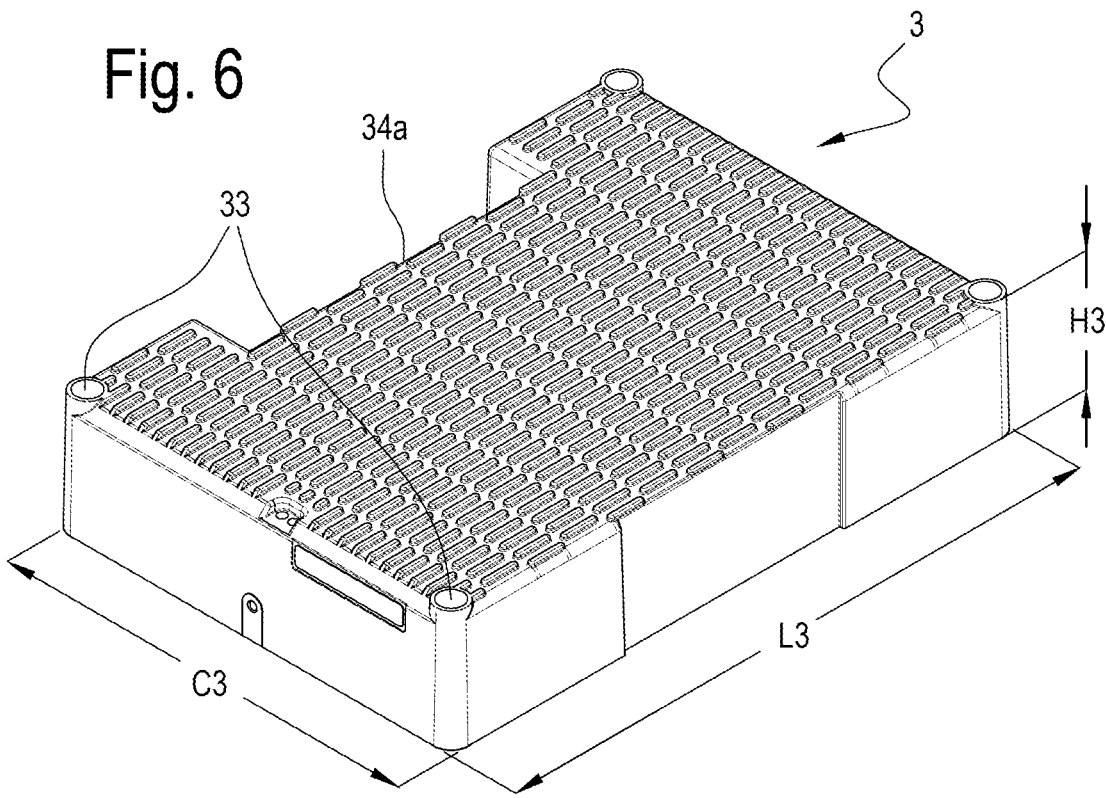
FIGS. 6 and 7 show respective perspective views of a third module of the acoustic amplification apparatus.
Figure 7:
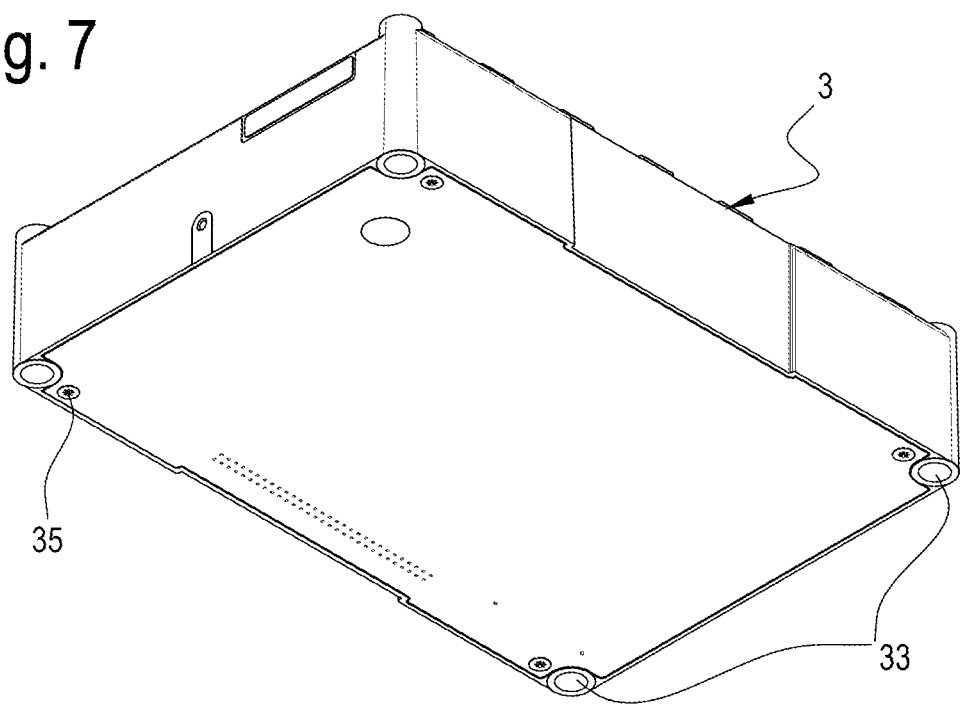
Figure 8:
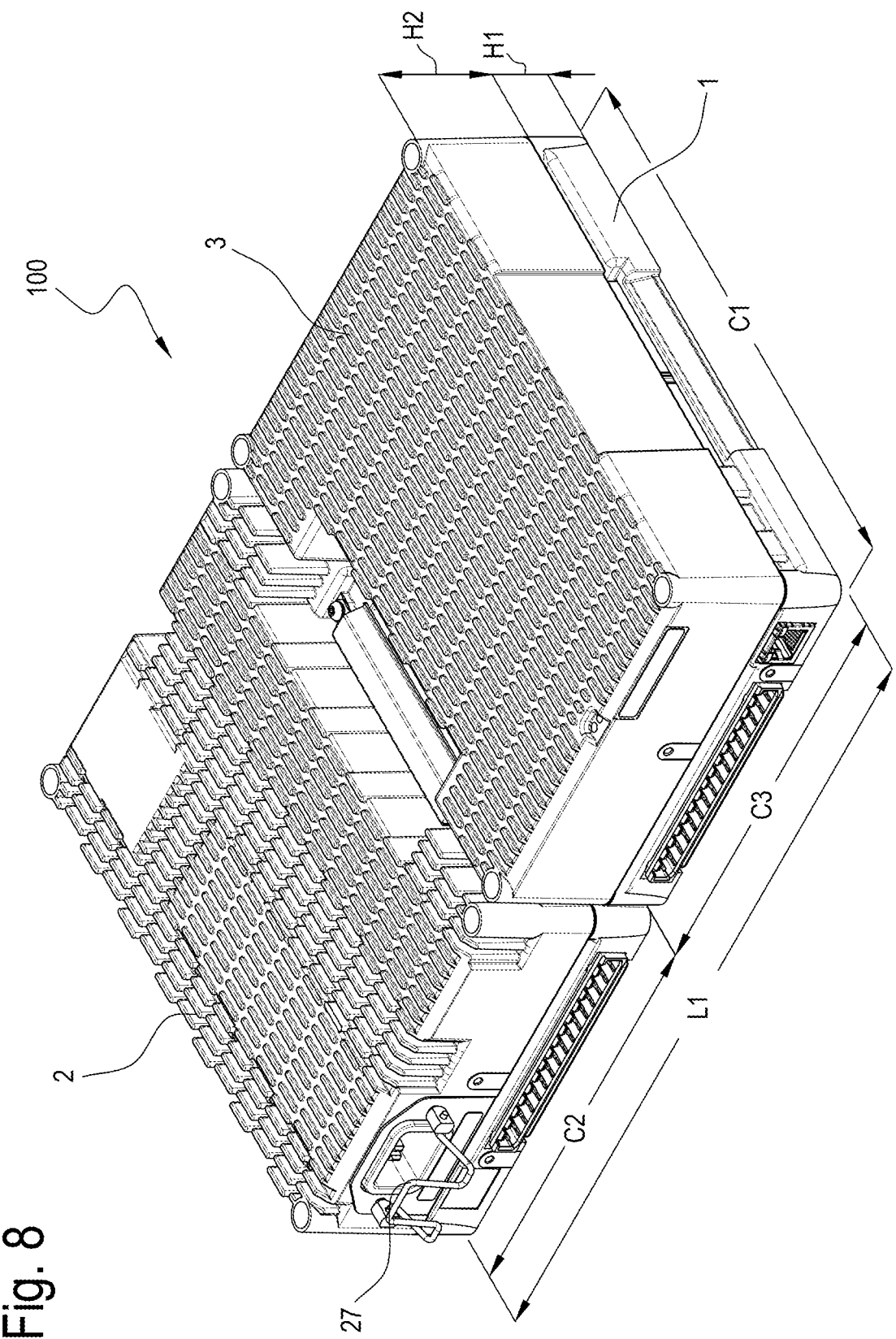
FIG. 8 shows an embodiment of the acoustic amplification apparatus.
Figure 9:
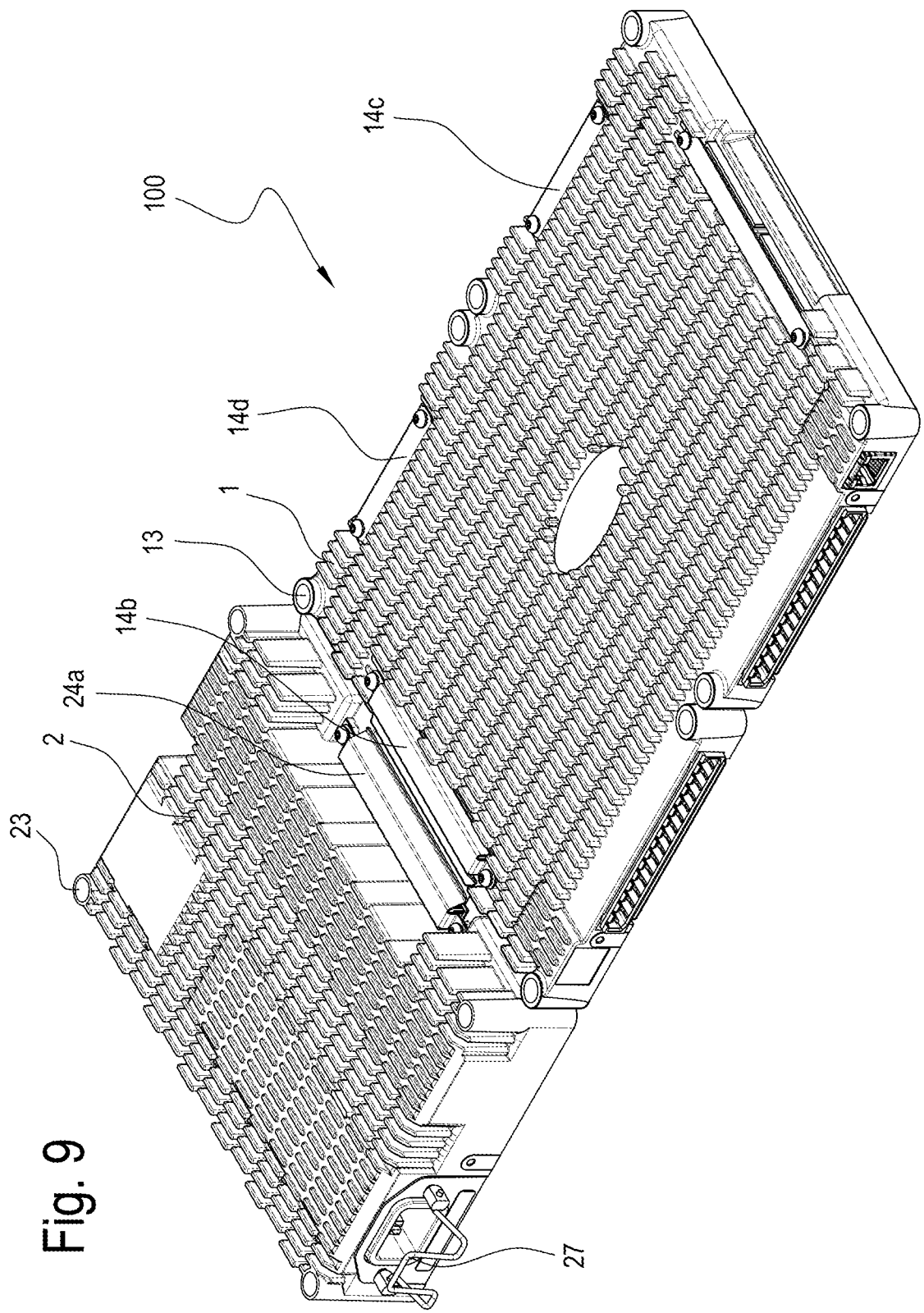
FIG. 9 shows a further embodiment of the acoustic amplification apparatus.
Figure 10:
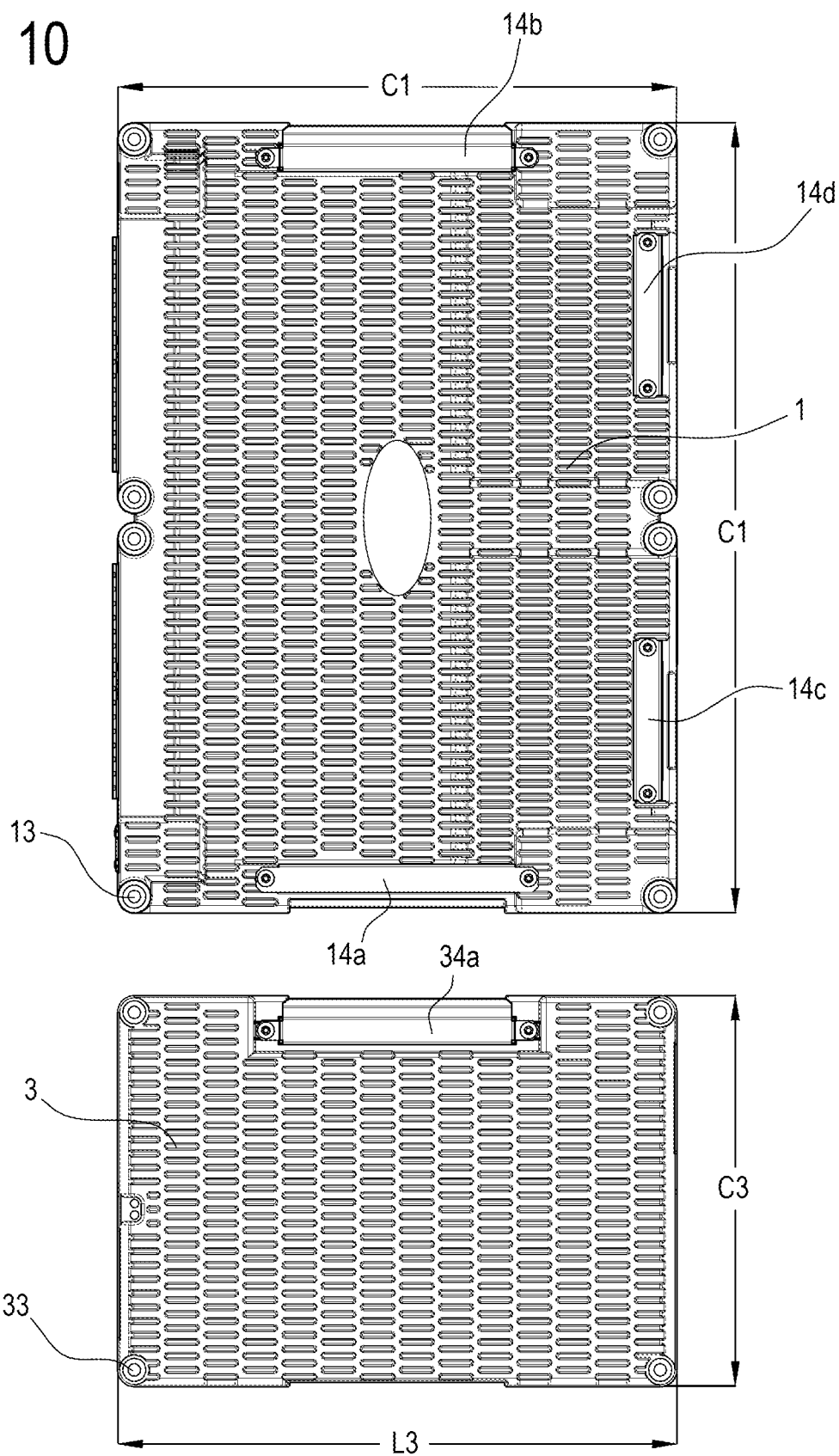
FIG. 10 shows the first and the third module, viewed from above.
Figure 11A:
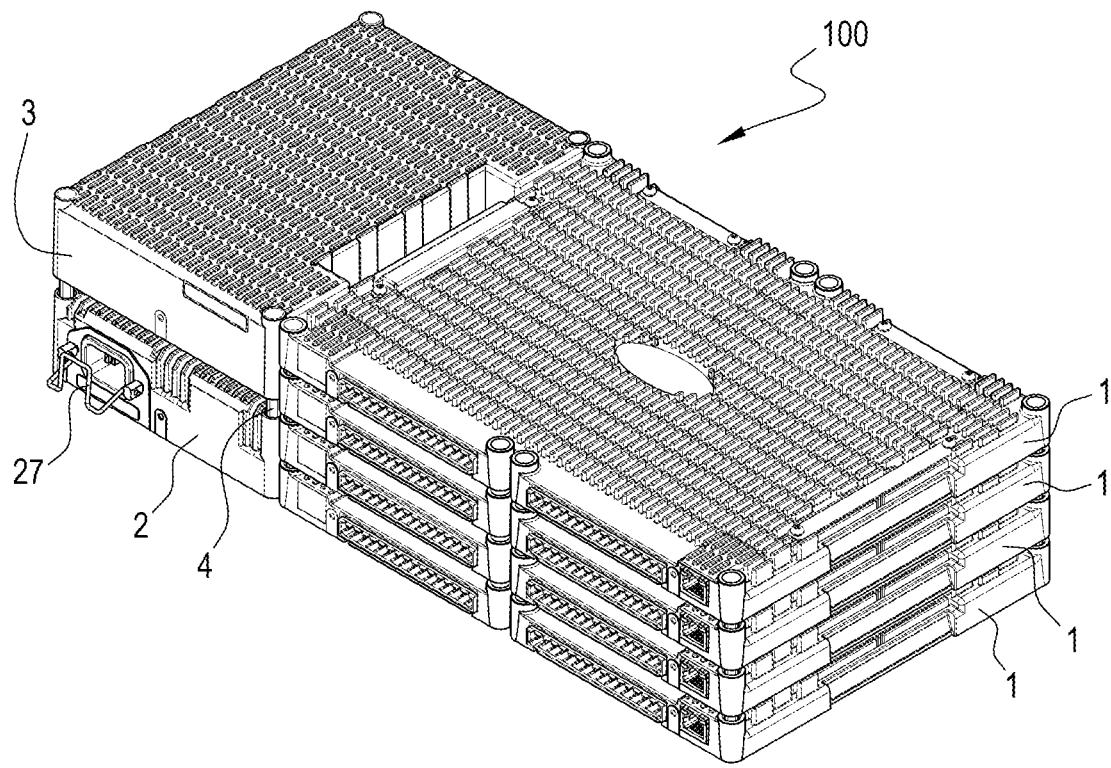
FIGS. 11A, 11B, 11O and 11D show respective views of the acoustic amplification apparatus according to a further embodiment.
Figure 11B:
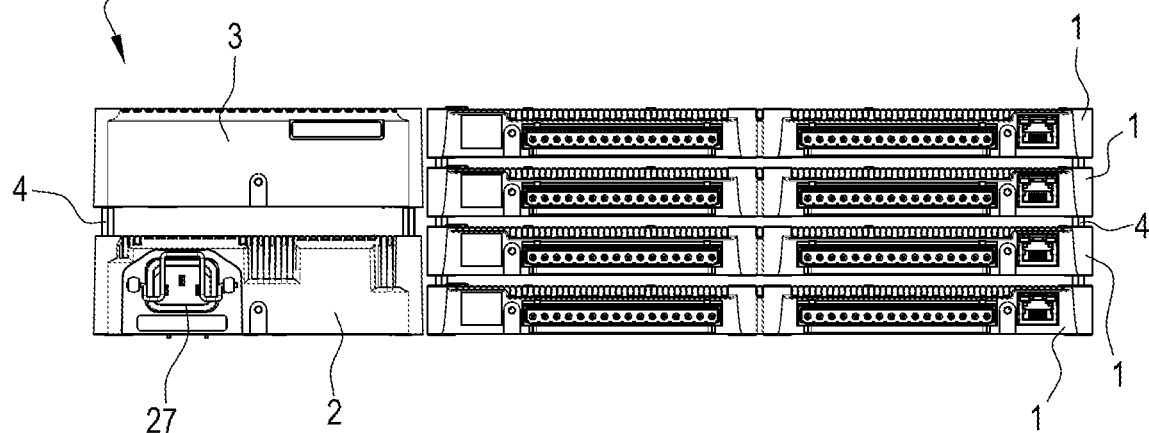
Figure 11C:
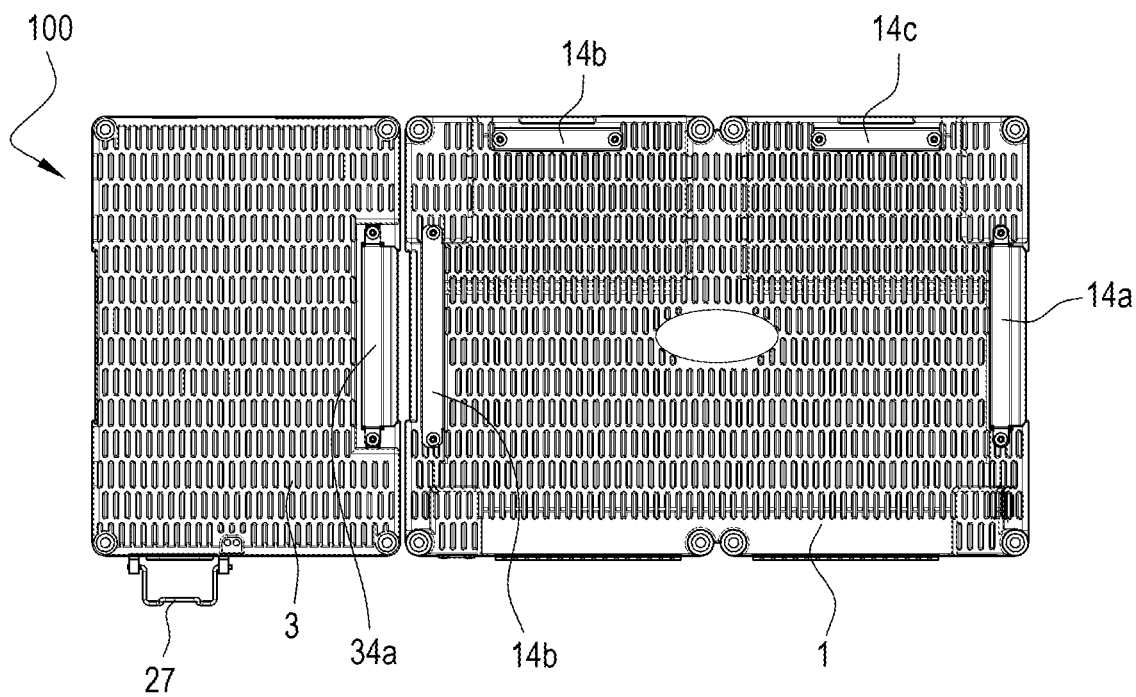
Figure 11D:
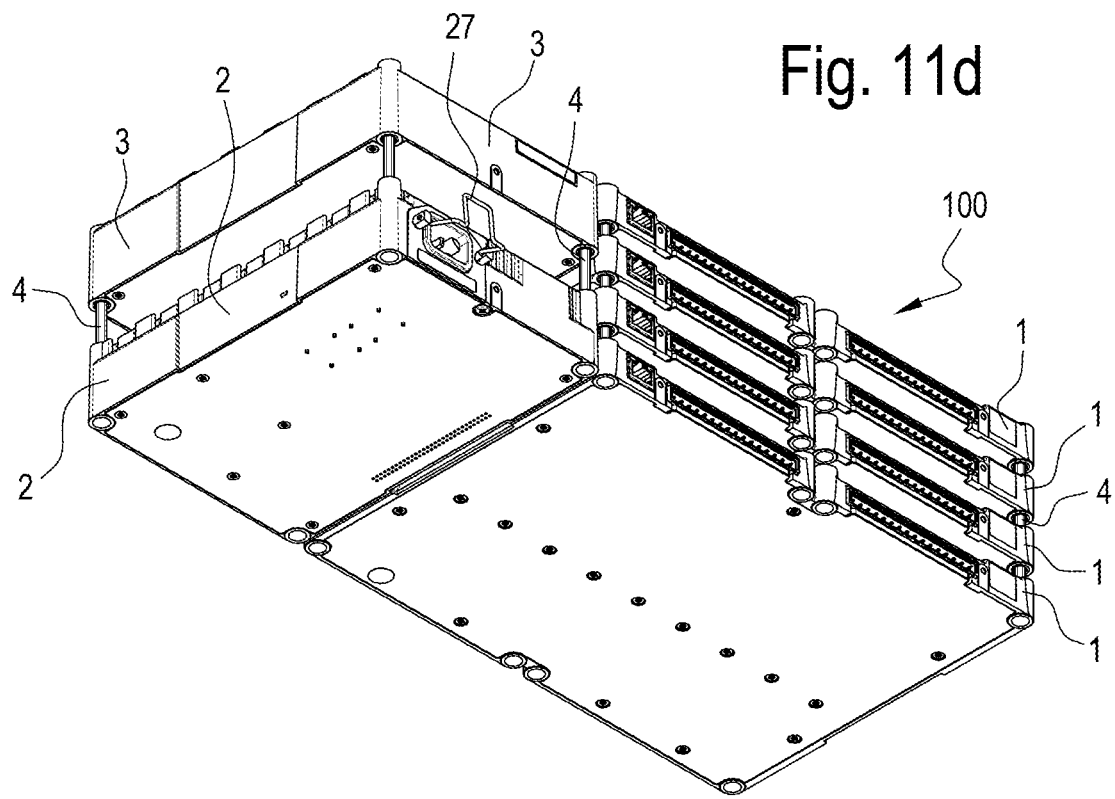
Figure 12:
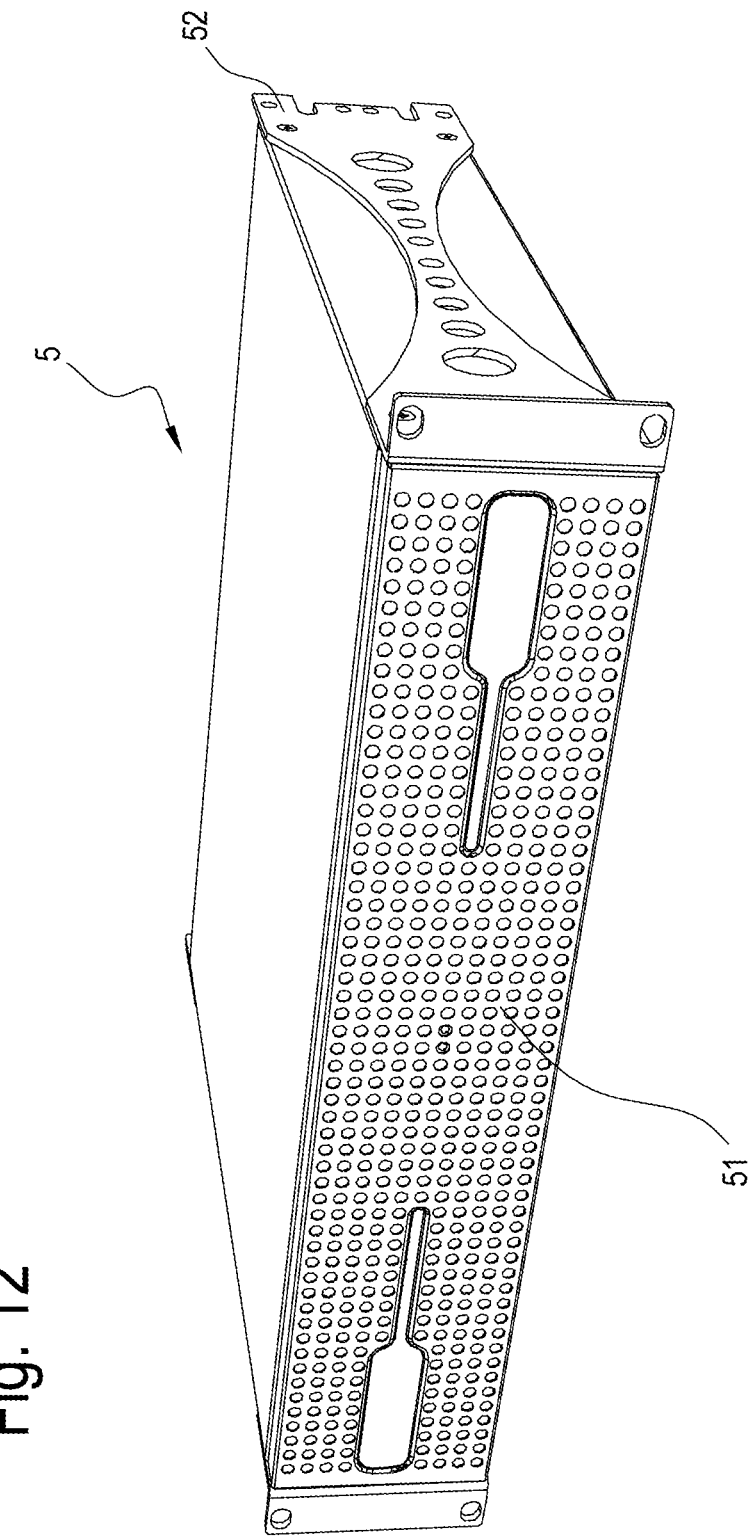
FIGS. 12 and 13 represent a fastening enclosure in which the acoustic amplification apparatus can be housed.
Figure 13:
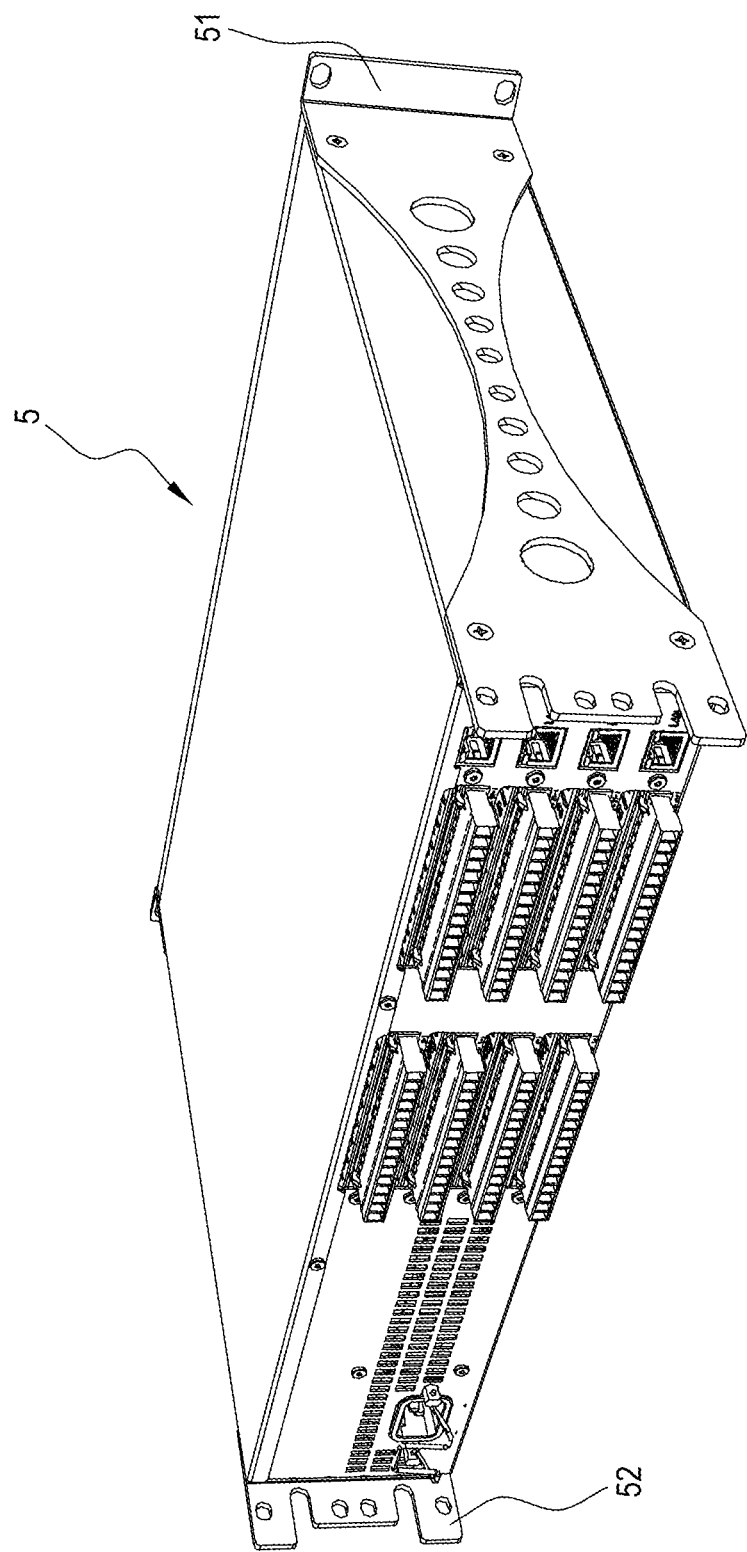
Figure 14:
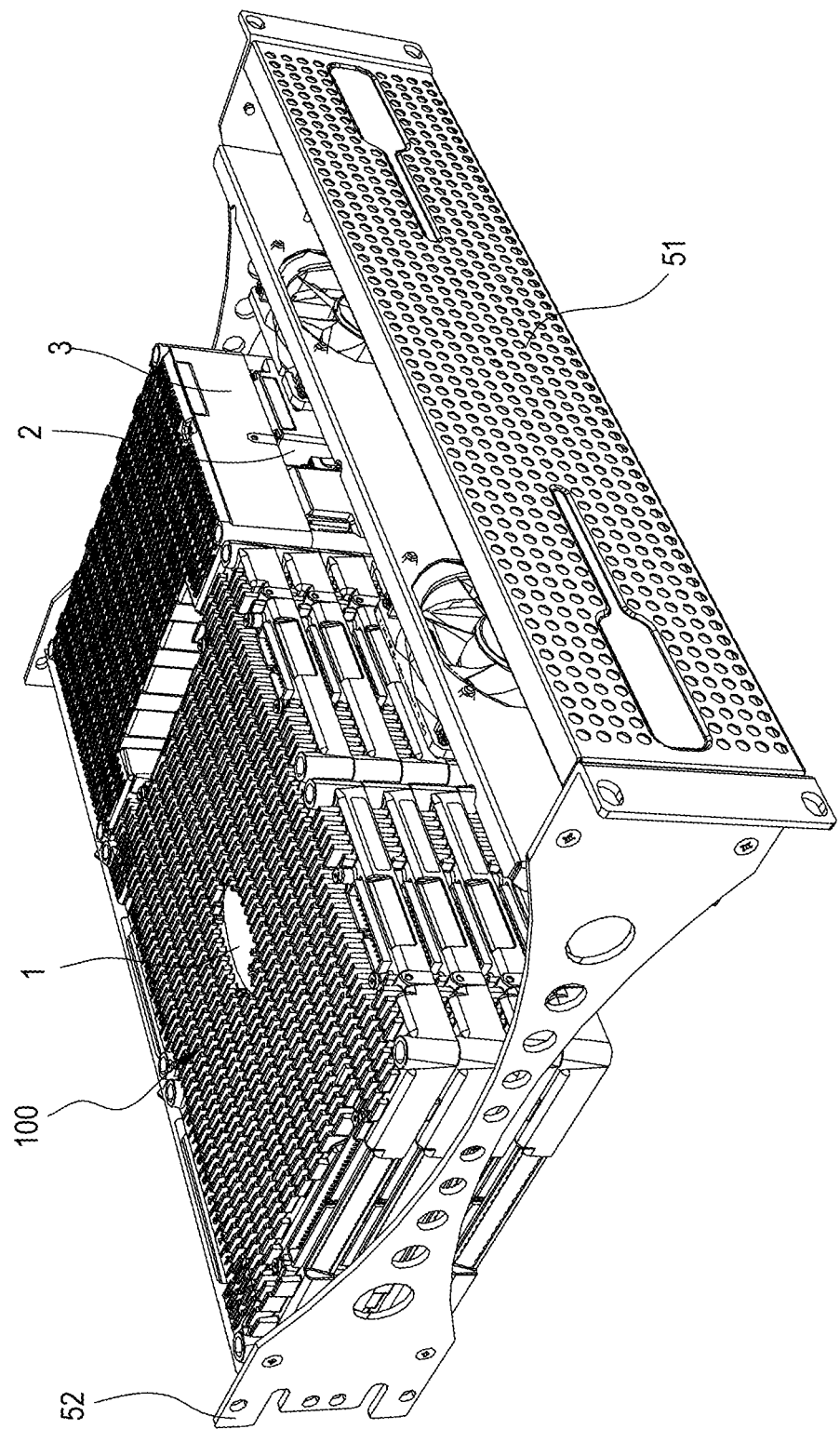
FIG. 14 shows a cutaway view of the fastening enclosure of FIGS. 12 and 13, with the acoustic amplification apparatus inside it.

With reference to this disclosure, the numeral 100 denotes a modular acoustic amplification apparatus.

The apparatus 100 comprises one or more of the following modules: a first module 1, a second module 2 and a third module 3.

The first module 1 includes a first casing 11. The second module 2 includes a second casing 21. The third module 3 includes a third casing 31.

The first module 1 comprises an acoustic amplifier 12, located inside the first casing 11. The second module 2 comprises a power supply, located in the second casing 21; the power supply is configured to power the acoustic amplifier 12. The power supply comprises an electrical energy connector 27, for connecting to an electrical network to tap electrical energy therefrom.

The third module 3 comprises an accumulator (of electrical energy), located in the third casing 31: the accumulator is configured to accumulate electrical energy and feed it to the acoustic amplifier 12 (that is, to the power supply).

The first casing 11, the second casing 21 and the third casing 31 are (approximately) in the shape of a parallelepiped. It should be noted that the accompanying drawings do not illustrate a fastening enclosure that may be provided.

The first casing 11 includes a first base, having a first long side and a first short side, and a first height H1. The first long side has a length L1; the first short side has a length C1, smaller than the length L1 of the first long side.

The second casing 21 includes a second base, having a second long side and a second short side, and a second height H2. The second long side has a length L2; the second short side has a length C2, smaller than the length L2 of the second long side.

The third casing 31 includes a third base, having a third long side and a third short side, and a third height H3. The third long side has a length L3; the third short side has a length C3, smaller than the length L3 of the third long side.

The length of the second long side L2 of the second casing 21 is equal to the length of the first short side C1 of the first casing 11. The length of the second short side C2 is half the length of the first long side L1. The first height H1 is half the second height H2.

The length of the third short side C3 of the third casing 31 is equal to the length of the second short side C2 of the second casing 21. The length of the third long side L3 of the third casing 31 is equal to the length of the second short side C2 of the second casing 21. The third height H3 is equal to the second height H2. Thus, the third module 3 has the same dimensions as the second module 2 and is interchangeable therewith. Therefore, the length of the third long side L3 of the third casing 31 is equal to the length of the first short side C1 of the first casing 11. The length of the third short side C3 is half the length of the first long side L1. The first height H1 is half the third height H3.

The first casing 11 has a finned upper base. More specifically, the first casing 11 comprises a plurality of fins 16 running parallel with the first short side C1 of the first casing 11.

The second casing 21 has a second upper base, parallel to the second base and defining a (further) plurality of fins 26 oriented in parallel with the second long side of the second casing 21.

The first casing 11, the second casing 21 and the third casing 31 each include respective fastening portions to allow connecting other casings (preferably removably).

The fastening portions of the first casing 11 include a first plurality of holes 13. The holes 13 extend along respective axes perpendicular to the first base of the first casing 11. In the embodiment illustrated, the holes 13 include four holes located at the corners of the first base; the holes 13 also include four holes, located in twos along the long sides at a position intermediate between the corners.

The fastening portions of the second casing 21 include a second plurality of holes 23. The holes 23 extend along respective axes perpendicular to the second base of the second casing 21. In the embodiment illustrated, the holes 23 include four holes located at the corners of the second base.

The fastening portions of the third casing 31 include a third plurality of holes 33. The holes 33 extend along respective axes perpendicular to the third base of the third casing 31. In the embodiment illustrated, the holes 33 include four holes located at the corners of the third base.

The holes 13, 23 and/or 33 are located along an outer perimeter of the first base, of the second base and/or of the third base, respectively.

The holes 13, 23 and/or 33 can be located at positions where they are aligned with each other to allow connecting the first module 1 to the second module 2 and/or to the third module 3. More specifically, the apparatus 100 may comprise fastening elements 4, such as, for example, pins or screws to be inserted into the mutually aligned holes 13, 23 and/or 33 to allow connection. More specifically, the holes 13, 23 and/or 33 and the fastening elements 4 are configured to allow connecting the first module 1 to the second module 2 and/or to the third module 3 in an operating configuration in which they are superposed on top of one another. In effect, the first, second and third casings 11, 12 and 13 are stackable.

More specifically, in an embodiment, the apparatus comprises the first module 1, the second module 2 and the third module 3; the second and third modules 2, 3 are mounted on top of the first module 1 so that the upper base 11 faces the second lower base of the second casing 21 and the third lower base of the third casing 31; the second casing 21 and the third casing 31 are juxtaposed with each other and preferably have a gap between them.

The first module 1 includes a plurality of electrical connectors 14a, 14b, 14c, 14d, preferably located along an outer perimeter of the first upper base of the first casing 11. More specifically, the electrical connectors 14a, 14b are bus connectors and are located along respective short sides of the first upper base; the connectors 14c, 14d are service connectors, located along one of the two long sides of the first upper base.

The second module 2 includes a respective electrical connector 24a, preferably located along an outer perimeter of the second upper base of the second casing 21. More specifically, the electrical connector 24a is a bus connector; the electrical connector 24a is located along one long side of the second upper base.

The third module 3 includes a respective electrical connector 34a, preferably located along an outer perimeter of the third upper base of the third casing 31. More specifically, the electrical connector 34a is a bus connector; the electrical connector 34a is located along one long side of the third upper base.

Preferably, the first casing 11, the second casing 21 and the third casing 31 each include an upper portion and a lower portion which are openable and closable to insert the amplifier, the power supply and the accumulator, respectively. The first casing 11, the second casing 21 and the third casing 31 each also comprise respective connectors 15, 25 and 35 to close the first casing 11, the second casing 21 and the third casing 31, respectively. In the embodiment illustrated, the connectors 15, 25 and 35 are screws that are insertable into holes made in the lower portion (that is, in the lower base) of the first casing 11, second casing 21 and third casing 31. The holes for inserting the connectors 15, 25 and 35 to close the casings are different from the holes 13, 23 and 33 for interconnecting the modules. The apparatus 100 may be positioned in a fastening enclosure 5. The fastening enclosure 5 may itself be part of the apparatus 100. The fastening enclosure comprises a facia panel 51 and trailing end members 52. The dimensions of the modules are selected to allow the modules to be installed in standard size racks.

The dimensions which the modules of this disclosure may have are given below by way of example. These example take into account the fact that such modules can be installed with respective fastening enclosures 5 (specifically, facia panel 51 and trailing end members 52) and that the dimensions of the apparatus are preferably referable to those of a rack unit.

A rack unit has a standard height of 1.75 inches or 44.5 mm (specifically, 44.45 mm). In the case where the modules have to be placed in the fastening enclosure 5, the second height H2 is, for example, between 42 mm and 44 (or 45) mm; in effect, the fastening module 5 is preferably a few mm high. Thus, the module and the fastening enclosure together will be approximately 1.75 inches high.

A rack unit has a standard width of 19 inches (482.6 mm) or 23 inches (584.2 mm). In the case where the modules have to be placed in the fastening enclosure 5, the sum of the lengths of the first long side and the second short side may be between 410 and 460 mm (in the case of a 19 inch rack unit) or between 510 and 560 mm (in the case of a 23 inch rack unit). In effect, the fastening enclosure is preferably between 1 and 3 inches (approximately 2 inches) wide, taking into account the facia panel 51 (in effect, by width we mean the horizontal dimension of the side on which the facia panel 51 is installed).

The invention claimed is:

1. A modular, acoustic amplification apparatus, comprising:
    a first module, including a first casing and an acoustic amplifier positioned inside the first casing, wherein the first casing has the shape of a parallelepiped having a first base and a first height (H1), wherein the first base has a first long side and a first short side;
    a second module including a second casing and a power supply or an accumulator positioned inside the second casing, wherein the second casing has the shape of a parallelepiped having a second base and a second height, wherein the second base has a second long side and a second short side,
wherein the first casing and the second casing include respective fastening portions which can be placed at a position where they are aligned with each other to allow connecting the first module to the second module, wherein the length of the second long side of the second casing is equal to the length of the first short side of the first casing, the length of the second short side is half the length of the first long side, and the first height is half the second height.

2. The apparatus according to claim 1, wherein the second height is between 42 mm and 45 mm.

3. The apparatus according to claim 1, wherein the sum of the length of the first long side and of the second short side is between 410 mm and 460 mm or between 510 mm and 560 mm.

4. The apparatus according to claim 1, wherein the first casing includes a first upper base, parallel to the first base and defining a plurality of fins oriented in parallel with the first short side.

5. The apparatus according to claim 1, comprising a third module, including a third casing having the shape of a parallelepiped with a third base and third height, wherein the third base has a third long side and a third short side, wherein the length of the third short side of the third casing is equal to the length of the second short side of the second casing and the length of the third long side of the third casing is equal to the length of the second short side of the second casing.

6. The apparatus according to claim 5, wherein the second module includes a power supply, positioned inside the second casing, and the third module includes an accumulator, positioned inside the third casing.

7. The apparatus according to claim 6, wherein the second casing has a second upper base, parallel to the second base and defining a plurality of fins oriented in parallel with the second long side.

8. The apparatus according to claim 1, wherein the first casing includes a first upper base, parallel to the first base and including a first plurality of holes,
wherein the second base of the second casing is superposable on the first upper base of the first casing and includes a second plurality of holes, aligned with the first plurality of holes to allow connecting the first module and the second module to each other.

9. The apparatus according to claim 1, wherein the first casing includes a first flank, parallel to the first height and to the first short side, and the second casing includes a second flank, parallel to the second height and to the second long side, wherein the fastening portions are configured to allow connecting the first module and the second module to each other in an operating configuration in which the first flank of the first casing is juxtaposed with the second flank of the second casing.

10. The apparatus according to claim 1, wherein the first module and the second module include respective electrical connectors, configured to allow electrically connecting the first module and the second module to each other, wherein at least one electrical connector of the first module is located along the first short side.

11. The apparatus according to claim 10, wherein the electrical connector of the second module is located along the second long side.

12. The apparatus according to claim 10, wherein the electrical connectors of the first module and of the second module are palindromic connectors.

13. The apparatus according to claim 1, wherein the dimensions of the first module and of the second module are selected to allow the first module and the second module to be installed in standard size racks.

14. A wave field synthesis system comprising a plurality of apparatuses, each apparatus being a modular, acoustic amplification comprising:
a first module, including a first casing and an acoustic amplifier positioned inside the first casing, wherein the first casing has the shape of a parallelepiped having a first base and a first height, wherein the first base has a first long side and a first short side;
a second module including a second casing and a power supply or an accumulator positioned inside the second casing, wherein the second casing has the shape of a parallelepiped having a second base and a second height, wherein the second base has a second long side and a second short side,
wherein the first casing and the second casing include respective fastening portions which can be placed at a position where they are aligned with each other to allow connecting the first module to the second module, wherein the length of the second long side of the second casing is equal to the length of the first short side of the first casing, the length of the second short side is half the length of the first long side, and the first height is half the second height.

15. A method for making an acoustic amplification apparatus, comprising the following steps:
preparing a first module, including a first casing and an acoustic amplifier positioned inside the first casing, wherein the first casing has the shape of a parallelepiped having a first base and a first height, wherein the first base has a first long side and a first short side;
preparing a second module including a second casing and a power supply or an accumulator positioned inside the second casing, wherein the second casing has the shape of a parallelepiped having a second base and a second height, wherein the second base has a second long side and a second short side;
connecting the first module to the second module by means of respective fastening portions of the first casing and of the second casing located at a position where they are aligned with each other,
wherein the length of the second long side of the second casing is equal to the length of the first short side of the first casing, the length of the second short side is half the length of the first long side, and the first height is half the second height.

16. The method according to claim 15, wherein the first module and the second module include respective electrical connectors, configured to allow electrically connecting the first module and the second module to each other, wherein at least one electrical connector of the first module is located along the first short side.

17. The method according to claim 16, wherein the electrical connector of the second module is located along the second long side.

18. The method according to claim 15, wherein the dimensions of the first module and of the second module are selected to allow the first module and the second module to be installed in standard size racks.

19. A modular, acoustic amplification apparatus, comprising:
a first module, including a first casing and an acoustic amplifier positioned inside the first casing, wherein the first casing has the shape of a parallelepiped having a first base and a first height (H1), wherein the first base has a first long side and a first short side;
a second module including a second casing and a power supply or an accumulator positioned inside the second casing, wherein the second casing has the shape of a parallelepiped having a second base and a second height, wherein the second base has a second long side and a second short side,
wherein the first casing and the second casing include respective fastening portions which can be placed at a position where they are aligned with each other to allow connecting the first module to the second module, wherein the length of the second long side of the second casing is equal to the length of the first short side of the first casing,
a third module, including a third casing having the shape of a parallelepiped with a third base and third height, wherein the third base has a third long side and a third short side, wherein the length of the third short side of the third casing is equal to the length of the second short side of the second casing and the length of the third long side of the third casing is equal to the length of the second short side of the second casing.

20. The apparatus according to claim 19, wherein the second module includes a power supply, positioned inside the second casing, and the third module includes an accumulator, positioned inside the third casing.

21. The apparatus according to claim 20, wherein the second casing has a second upper base, parallel to the second base and defining a plurality of fins oriented in parallel with the second long side.

22. A modular, acoustic amplification apparatus, comprising:
a first module, including a first casing and an acoustic amplifier positioned inside the first casing, wherein the first casing has the shape of a parallelepiped having a first base and a first height (H1), wherein the first base has a first long side and a first short side;

a second module including a second casing and a power supply or an accumulator positioned inside the second casing, wherein the second casing has the shape of a parallelepiped having a second base and a second height, wherein the second base has a second long side and a second short side, wherein the first casing and the second casing include respective fastening portions which can be placed at a position where they are aligned with each other to allow connecting the first module to the second module, wherein the length of the second long side of the second casing is equal to the length of the first short side of the first casing, wherein the first casing includes a first upper base, parallel to the first base and including a first plurality of holes, wherein the second base of the second casing is superposable on the first upper base of the first casing and includes a second plurality of holes, aligned with the first plurality of holes to allow connecting the first module and the second module to each other.

23. A modular, acoustic amplification apparatus, comprising:

a first module, including a first casing and an acoustic amplifier positioned inside the first casing, wherein the first casing has the shape of a parallelepiped having a first base and a first height (H1), wherein the first base has a first long side and a first short side;

a second module including a second casing and a power supply or an accumulator positioned inside the second casing, wherein the second casing has the shape of a parallelepiped having a second base and a second height, wherein the second base has a second long side and a second short side, wherein the first casing and the second casing include respective fastening portions which can be placed at a position where they are aligned with each other to allow connecting the first module to the second module, wherein the length of the second long side of the second casing is equal to the length of the first short side of the first casing, wherein the first casing includes a first flank, parallel to the first height and to the first short side, and the second casing includes a second flank, parallel to the second height and to the second long side, wherein the fastening portions are configured to allow connecting the first module and the second module to each other in an operating configuration in which the first flank of the first casing is juxtaposed with the second flank of the second casing.

* * * * *